United States Patent
Sadowski

(10) Patent No.: US 9,685,953 B1
(45) Date of Patent: Jun. 20, 2017

(54) LOW LATENCY ASYNCHRONOUS INTERFACE CIRCUITS

(71) Applicant: Advanced Micro Devices, Inc., Sunnyvale, CA (US)

(72) Inventor: Greg Sadowski, Cambridge, MA (US)

(73) Assignee: ADVANCED MICRO DEVICES, INC., Sunnyvale, CA (US)

(*) Notice: Subject to any disclaimer, the term of this patent is extended or adjusted under 35 U.S.C. 154(b) by 0 days.

(21) Appl. No.: 15/261,438

(22) Filed: Sep. 9, 2016

(51) Int. Cl.
*H03K 19/00* (2006.01)
*H03K 19/003* (2006.01)
*H03K 19/0185* (2006.01)

(52) U.S. Cl.
CPC . *H03K 19/00315* (2013.01); *H03K 19/01855* (2013.01); *H03K 19/018521* (2013.01)

(58) Field of Classification Search
CPC ..... H03K 3/02335; H03K 3/03; H03K 3/0375
USPC ..................................... 326/93–94
See application file for complete search history.

(56) References Cited

U.S. PATENT DOCUMENTS

| | | | | |
|---|---|---|---|---|
| 5,045,801 A | * | 9/1991 | Mowery | H03K 3/0375 326/94 |
| 5,151,986 A | | 9/1992 | Langan et al. | |
| 6,738,442 B1 | * | 5/2004 | Wilcox | H03K 5/135 327/142 |
| 6,781,429 B1 | | 8/2004 | Smith | |
| 6,924,681 B2 | | 8/2005 | Staszewski et al. | |
| 2002/0135408 A1 | * | 9/2002 | Chiu | G06F 1/08 327/145 |
| 2014/0140159 A1 | * | 5/2014 | Fishleigh | G11C 7/222 365/205 |

OTHER PUBLICATIONS

Steininger, A. (Jan. 17, 2016), Advanced Digital Design GALS Design [PDF]. Retrieved from http://documentslide.com/documents/advanced-digital-design-gals-design-andreas-steininger-vienna-university-of.html.

* cited by examiner

*Primary Examiner* — Jason M Crawford
(74) *Attorney, Agent, or Firm* — Polansky & Associates, P.L.L.C.; Paul J. Polansky

(57) ABSTRACT

In one form, a logic circuit includes an asynchronous logic circuit, a synchronous logic circuit, and an interface circuit coupled between the asynchronous logic circuit and the synchronous logic circuit. The asynchronous logic circuit has a plurality of asynchronous outputs for providing a corresponding plurality of asynchronous signals. The synchronous logic circuit has a plurality of synchronous inputs corresponding to the plurality of asynchronous outputs, a stretch input for receiving a stretch signal, and a clock output for providing a clock signal. The synchronous logic circuit provides the clock signal as a periodic signal but prolongs a predetermined state of the clock signal while the stretch signal is active. The asynchronous interface detects whether metastability could occur when latching any of the plurality of the asynchronous outputs of the asynchronous logic circuit using said clock signal, and activates the stretch signal while the metastability could occur.

20 Claims, 4 Drawing Sheets

LOW LATENCY ASYNCHRONOUS INTERFACE CIRCUITS

STATEMENT REGARDING GOVERNMENT SPONSORED RESEARCH

This invention was made with Government support under Prime Contract Number DE-AC52-07NA27344, Subcontract No. B600716 awarded by the Department of Energy (DOE). The Government has certain rights in this invention.

BACKGROUND

One challenge in digital logic design is how to pass signals between different timing domains quickly and reliably. In modern logic circuits, such as graphics processing units (GPUs) and advanced processing units (APUs) in which one or more GPUs is combined with one or more central processing unit (CPU) cores, the number of different timing domains is large and is increasing. For example, modern GPUs are massively parallel and incorporate a large number of heterogeneous processing cores that exchange data and control signals. These processing cores are internally synchronous but operate asynchronously with respect to each other because their respective clock signals have no predefined relationship.

In this environment, interface circuits between clock domains have two problems. First, when clocking signals from one timing domain into another timing domain, the signals may experience metastability. Metastability can arise when data is transferred between two clock domains that operate asynchronously with respect to each other. Capturing circuits such as flip-flops are unable to capture an input signal when the input signal changes during a transition in the clock signal, since the input signal is in mid-transition. Not only is the data not captured correctly at that clock edge, but the capturing circuit may itself capture an intermediate mid-point value which is then output to the next stage requiring data. Moreover the time it takes for the capturing circuit to become "unconfused" can in some rare cases be quite long. Once a flip-flop becomes metastable, its output can take a significant amount of time to correctly transition to a recognizable logic state, and sometimes this logic state is not the correct one. The output signal can take many forms during metastability, such as assuming an intermediate voltage and oscillating for an extended period.

Second, ensuring reliable transmission increases latency and impacts performance of the chip. Known interfaces that reduce metastability require a number of clock cycles, which increases latency and lowers the performance of the system, or requires expensive buffering.

Figure 1:
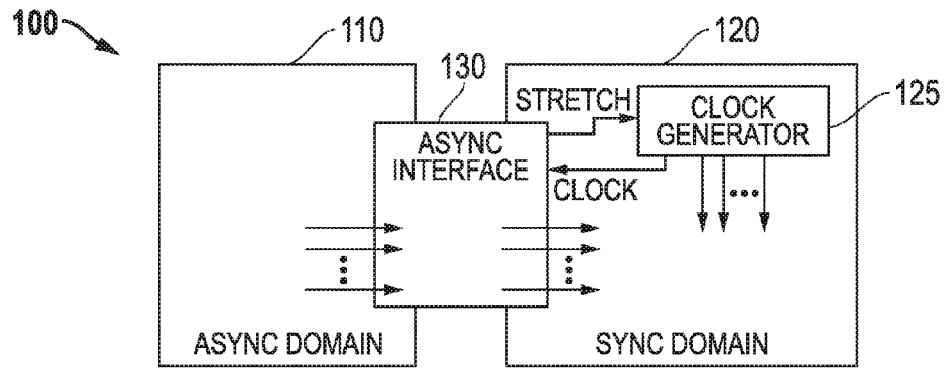
FIG. 1 illustrates in block diagram form a logic circuit according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a logic circuit includes an asynchronous logic circuit, a synchronous logic circuit, and an interface circuit coupled between the asynchronous logic circuit and the synchronous logic circuit. The asynchronous logic signal can be truly asynchronous or can also be clocked using a clock signal that has no definite relationship to a clock signal used by the synchronous logic circuit. The asynchronous logic circuit has a plurality of asynchronous outputs for providing a corresponding plurality of asynchronous signals. The synchronous logic circuit has a plurality of synchronous inputs corresponding to the plurality of asynchronous outputs, a stretch input for receiving a stretch signal, and a clock output for providing a clock signal. The synchronous logic circuit provides the clock signal as a periodic signal but prolongs a predetermined state of the clock signal while the stretch signal is active. The asynchronous interface detects whether metastability could occur when latching any of the plurality of the asynchronous outputs of the asynchronous logic circuit using the clock signal, and activates the stretch signal while the metastability could occur.

In another form, an asynchronous interface circuit includes a plurality of metastability detector circuits and a logic gate. The plurality of metastability detector circuits corresponds to each of a plurality of asynchronous signals. Each of the plurality of metastability detector circuits activates a corresponding metastability signal in response to detecting that metastability could occur when latching a corresponding asynchronous signal with respect to a predetermined transition of a clock signal. The logic gate activates a stretch signal in response to an activation of the metastability signal of at least one of the plurality of metastability detector circuits.

In yet another form, a method can be used to detect metastability when capturing asynchronous logic signals in a synchronous domain. A plurality of asynchronous logic signals are received. A corresponding metastability condition of each of the plurality of asynchronous logic signals is detected with respect to a first transition of a clock signal. Whether the corresponding metastability condition exists for any of the plurality of asynchronous logic signals with respect to the first transition of the clock signal is detected. The corresponding metastability condition indicates that metastability could occur when latching a corresponding asynchronous logic signal using said first transition of said clock signal. A predetermined state of the clock signal following the first transition is stretched as long as the corresponding metastability condition exists for at least one of the plurality of asynchronous logic signals with respect to the first transition of the clock signal.

FIG. 1 illustrates in block diagram form a logic circuit 100 according to some embodiments. Logic circuit 100 includes generally an asynchronous logic circuit 110, a synchronous logic circuit 120, and an asynchronous interface 130 connected between asynchronous logic circuit 110 and synchronous logic circuit 120. Asynchronous logic circuit 110 provides a set of asynchronous signals on a corresponding set of asynchronous outputs. Synchronous logic circuit 120 has a set of synchronous inputs corresponding to the set of asynchronous outputs, a stretch input for receiving a signal labeled "STRETCH", and a clock output for providing a clock signal labeled "CLOCK". Asynchronous interface 130 has a set of inputs connected to the set of asynchronous outputs of asynchronous logic circuit 110, a set of outputs connected to the set of inputs of synchronous logic circuit 120, an output for providing the STRETCH signal, and an input for receiving the CLOCK signal.

Asynchronous logic circuit 110 is asynchronous with respect to synchronous logic circuit 120. In one embodiment, asynchronous logic circuit 110 is purely asynchronous. In another embodiment, asynchronous logic circuit 110 operates according to an internal clock signal that is asynchronous to the CLOCK signal used by synchronous logic circuit 120.

Synchronous logic circuit 120 includes a clock generator 125 that generates the CLOCK signal to time the internal operations of synchronous logic circuit 120 as well as to time the reception of data from asynchronous interface 130. Clock generator 125 provides a clock tree that has a set of outputs for providing different branches of the CLOCK signal and other similar clock signals at the same frequency but isolated from each other.

Asynchronous interface 130 receives the CLOCK signal from clock generator 125. It detects whether metastability could occur when latching any of the asynchronous signals of asynchronous logic circuit 110 using the CLOCK signal. In other words, asynchronous interface 130 detects when one or more of the asynchronous outputs of asynchronous logic circuit 110 changes so close in time to the change in the CLOCK signal that it cannot reliably capture the data and if a simple latch were used to capture the data, the latch could go metastable. In this case, asynchronous interface 130 activates the STRETCH signal, and keeps the STRETCH signal active as long as the metastability could occur. In response to the STRETCH signal, clock generator 125 in synchronous logic circuit 120 keeps the CLOCK signal in a certain logic state as long as the STRETCH signal is active.

To take one example, asynchronous interface 130 may latch data from asynchronous logic circuit 110 on the rising edge of the CLOCK signal. Asynchronous interface 130 detects whether any of the asynchronous signals is metastable with respect to the rising edge of the clock. If so, it activates the STRETCH signal, and clock generator 125 keeps the CLOCK signal in the logic high state until asynchronous interface 130 detects that none of the asynchronous signals is metastable. Once all metastable states resolve, then asynchronous interface 130 deactivates the STRETCH signal, and clock generator 125 generates a further transition of the CLOCK signal to capture the asynchronous signals that have just stabilized in asynchronous interface 130. Thus logic circuit 100 provides the reliable transition of signals from one domain that is asynchronous to another domain without making assumptions about the length of the metastability and without excessive delay. The delay period ends as soon as the metastability resolves.

Figure 2:
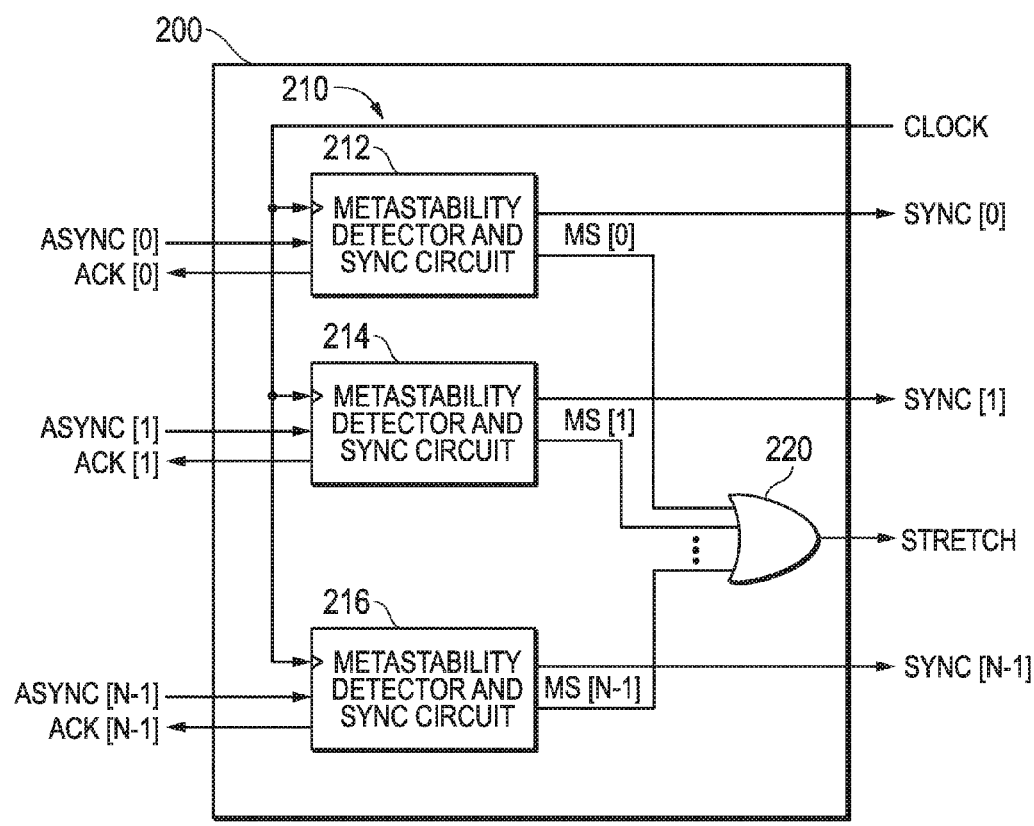
FIG. 2 illustrates in block diagram form an asynchronous interface suitable for use in the logic circuit of FIG. 1.

FIG. 2 illustrates in block diagram form an asynchronous interface circuit 200 suitable for use in logic circuit 100 of FIG. 1. Asynchronous interface circuit 200 includes generally a set of metastability detector and sync circuits 210 and a logic gate 220. Shown in FIG. 2 is a representative set of metastability detector and sync circuits including metastability detector and sync circuits 212, 214, and 216. Asynchronous interface circuit 200 uses these metastability detector and sync circuits 212, 214, and 216 not only to detect the metastability in the particular asynchronous signal with respect to the CLOCK signal, but also to capture the state of the signal after the metastability (if any) ends.

Each metastability detector and sync circuit includes a signal input for receiving a corresponding asynchronous signal, a clock input for receiving the CLOCK signal, an output for providing a corresponding synchronous signal, a control output for providing a metastability signal, and a handshake output for providing an acknowledgment signal. For example metastability detector and sync circuit 212 includes a signal input for receiving a corresponding asynchronous signal labeled "ASYNC [0]", a clock input for receiving the CLOCK signal, an output for providing a corresponding synchronous signal labeled "SYNC[0]", a control output for providing a metastability signal labeled "MS[0]", and a handshake output for providing an acknowledgment signal labeled "ACK[0]". Thus if asynchronous interface circuit 200 receives an N-bit asynchronous signal, the metastability detector and sync circuits include a signal input for receiving a corresponding asynchronous signal ASYNC[i], a clock input for receiving the CLOCK signal, an output for providing a corresponding synchronous signal SYNC[i], a control output for providing a metastability signal MS[i], and a handshake output for providing an acknowledgment signal ACK[i], for i=1 to N−1.

In asynchronous interface circuit 200, the metastability signals and the STRETCH signal are both active high, so logic gate 220 takes the form of an N-input OR gate. In various embodiments, the individual metastability signals could be active low while the STRETCH signal is active high and logic gate 220 could be implemented as an N-bit NAND gate; the individual metastability signals could be active high while the STRETCH signal is active low and logic gate 220 could be implemented as an N-bit NOR gate; and the individual metastability signals could be active low while the STRETCH signal is active low and logic gate 220 could be implemented as an N-bit AND gate.

Figure 3:
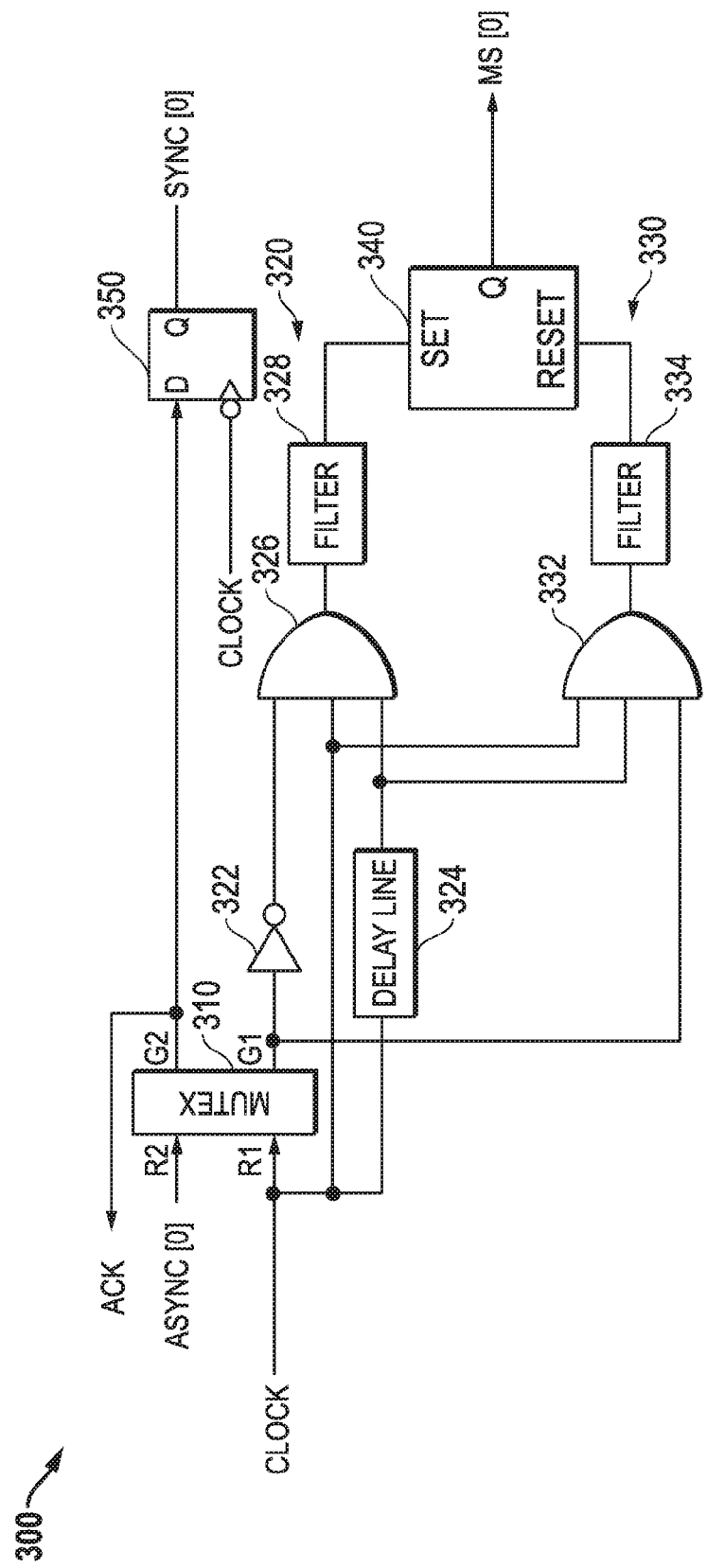
FIG. 3 illustrates in block diagram form a metastability detector and synchronization circuit suitable for use in the asynchronous interface circuit of FIG. 2.

FIG. 3 illustrates in block diagram form a metastability detector and synchronization circuit 300 suitable for use in asynchronous interface circuit 200 of FIG. 2. Metastability detector and synchronization circuit 300 includes a mutual exclusion circuit (MUTEX) 310, an abnormal detection circuit 320, a normal detection circuit 330, an SR flip-flop 340, and an output latch 350. Mutual exclusion circuit 310 has a first request input labeled "R1" for receiving the CLOCK signal, a second request input labeled "R2" for receiving the ASYNC[0] signal, a first grant output labeled "G1", and a second grant output labeled "G2" for providing the ACK[0] signal.

Abnormal detection circuit 320 includes an inverter 322, a delay line 324, an AND gate 326, and a filter 328. Inverter 322 has an input connected to the G1 output of mutual exclusion circuit 310, and an output. Delay line 324 has an input for receiving the CLOCK signal, and an output. AND gate 326 has a first input connected to the output of inverter 322, a second input for receiving the CLOCK signal, a third input connected to the output of delay line 324, and an output. Filter 328 has an input connected to the output of AND gate 326, and an output for providing a set signal.

Normal detection circuit 330 includes an AND gate 332, and a filter 334. AND gate 332 has a first input for receiving the CLOCK signal, a second input connected to the output of delay line 324, a third input connected to the G1 output of mutual exclusion circuit 310, and an output. Filter 334 has an input connected to the output of AND gate 332, and an output for providing a reset signal.

SR flip-flop 340 is a storage element that has a set input connected to the output of filter 328, a reset input connected to the output of filter 334, and an output for providing metastability signal MS[0]. Latch 350 is storage element that has a data (D) input connected to the G2 output of mutual exclusion circuit 310, an active-low clock input for receiving the CLOCK signal and an output (Q) for providing the SYNC[0] signal. In some embodiments, latch 350 can be implemented using an edge-triggered flip-flop.

In operation, mutual exclusion circuit 310 determines a priority of activations of its input signals. It activates G1 in response to an activation of R1 if it senses R2 is not active, and activates G2 in response to an activation of R2 if it senses R1 is not active. It keeps both G1 and G2 inactive if it detects metastability between R1 and R2, and keeps both signals inactive as long as the metastability persists.

Abnormal detection circuit 320 activates the set signal at its output to the S input of SR flip-flop 340 if the G1 signal is inactive while the clock signal is active for a predetermined time. The predetermined time is determined by the delay through delay line 324. This if both the delayed version of the CLOCK signal and the CLOCK signal itself are high while G1 remains low, then all three inputs to AND gate 326 are high and abnormal detection circuit 320 activates the set input to SR flip-flop 340 to set metastability signal MS[0]. This operation occurs if mutual exclusion circuit 310 detects metastability between R1 and R2, and thus keeps G1 low. Abnormal detection circuit 320 uses filter 328 to filter out any transient pulse or glitch in the output of AND gate 326.

Normal detection circuit 330 activates the reset signal at its output to the R input of SR flip-flop 340 if the G1 signal is active while the clock signal is active for a predetermined time. The predetermined time is determined by the delay through delay line 324 and thus delay line 324 is shared between abnormal detection circuit 320 and normal detection circuit 330. If both the delayed version of the CLOCK signal and the CLOCK signal itself are high while G1 is also high, then all three inputs to AND gate 332 are high and normal detection circuit 330 activates the reset input to SR flip-flop 340, which will clear any previously set metastability signal MS[0]. This operation occurs if mutual exclusion circuit 310 detects no metastability between R1 and R2 on the activation of R1 and thus activates G1 at a logic high. Normal detection circuit 330 uses filter 334 to filter out any transient pulse or glitch in the output of AND gate 332.

Output latch 350 latches the G2 output of mutual exclusion circuit 310 on a high-to-low transition of the CLOCK signal. Thus, metastability detector and synchronization circuit 300 attempts to capture ASYNC[0] on the rising edge of the CLOCK signal and provides it to the output on the falling edge of the CLOCK signal. Thus synchronous logic circuit 120 can capture the SYNC[0] signal on the rising edge of the CLOCK signal. However asynchronous interface 130 provides the STRETCH signal and synchronous logic circuit 120 stretches the high period of the CLOCK signal until the metastability resolves.

Figure 4:
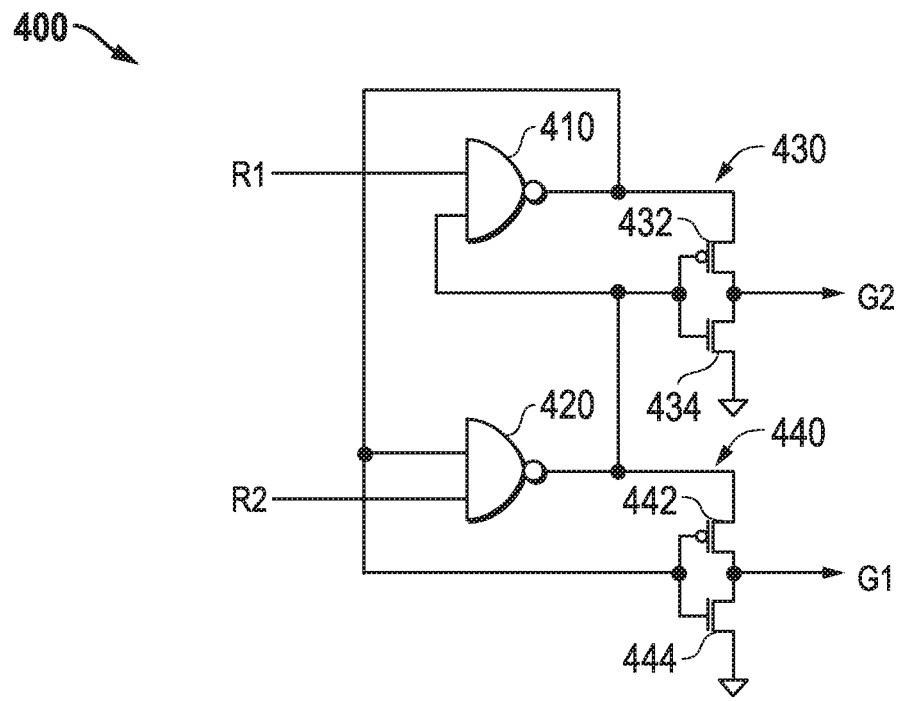
FIG. 4 illustrates in partial logic diagram and partial schematic for a mutual exclusion circuit suitable for use in the metastability detector and synchronization circuit of FIG. 3.

FIG. 4 illustrates in partial logic diagram and partial schematic for a mutual exclusion circuit 400 suitable for use in metastability detector and synchronization circuit 300 of FIG. 3. Mutual exclusion circuit 400 includes generally NAND gates 410 and 420 and inverters 430 and 440. NAND gate 410 has a first input for receiving the R1 signal, a second input, and an output. NAND gate 420 has a first input connected to the output of NAND gate 410, a second input for receiving the R2 signal, and an output connected to the second input of NAND gate 410. Inverter 430 includes a P-channel transistor 432, and an N-channel transistor 434. Transistor 432 has a source connected to the output of NAND gate 410, a gate connected to the output of NAND gate 420, and a drain for providing the G2 signal. Transistor 434 has a drain connected to the drain of transistor 432, a gate connected to the output of NAND gate 420, and a source connected to ground. Inverter 440 includes a P-channel transistor 442, and an N-channel transistor 444. Transistor 442 has a source connected to the output of NAND gate 420, a gate connected to the output of NAND gate 410, and a drain for providing the G1 signal. Transistor 444 has a drain connected to the drain of transistor 442, a gate connected to the output of NAND gate 410, and a source connected to ground.

If R1 goes high while R2 is low, NAND gate 420 provides a logic high on its output. The logic high causes inverter 440 to be active. Since both inputs of NAND gate 410 are high, NAND gate 410 provides a logic low on its output, causing inverter 430 to be inactive. However the high voltage at the output of NAND gate 420 is provided to the gate of transistor 434, which makes it conductive and causes it to drive G2 low. Since inverter 440 is active and its input is low, it provides G1 at a logic high.

If R2 goes high while R1 is low, NAND gate 410 provides a logic high on its output. The logic high causes inverter 430 to be active. Since both inputs of NAND gate 420 are high, NAND gate 420 provides a logic low on its output, causing inverter 440 to be inactive. However the high voltage at the output of NAND gate 410 is provided to the gate of transistor 444, which makes it conductive and causes it to drive G1 low. Since inverter 430 is active and its input is low, it provides G2 at a logic high.

If R1 and R2 are both low and go high at about the same time, mutual exclusion circuit 400 becomes metastable and keeps both G1 and G2 low. Since R1 and R2 start out in a low state, the outputs of NAND gates 410 and 420 are both high and inverters 430 and 440 are both active. The high voltages at the inputs of inverters 430 and 440 cause them to provide their respective outputs at a logic low. As both R1 and R2 rise in voltage, NAND gates 410 and 420 both provide outputs that start to transition to low levels. However as the outputs of NAND gates 410 and 420 start to go low, the logic low levels start to cause the outputs to go high. This reinforcing action will cause the outputs to oscillate until one path is stronger than the other. However since inverters 430 and 440 are not powered by the power supply voltage terminal but rather the outputs of the NAND gates themselves, they are prevented from driving either G output high until the voltage at the output of one NAND gate provides a voltage that is higher than the voltage at the output of the other NAND gate by more than a threshold voltage of P-channel transistor 432 or 442. At this point, the separation in outputs of NAND gates 410 and 420 is sufficient to indicate the priority of the arrival of the signals and to cause mutual exclusion circuit 400 to indicate the first detected low-to-high transition.

Mutual exclusion circuit 400 could be modified for active-low logic by replacing NAND gates 410 and 420 with corresponding NOR gates.

Figure 5:
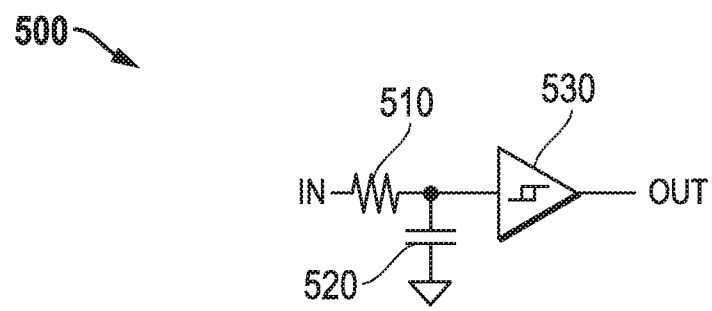
FIG. 5 illustrates in partial block diagram and partial schematic form a filter suitable for use in the metastability detector and synchronization circuit of FIG. 3.

FIG. 5 illustrates in partial block diagram and partial schematic form a filter 500 suitable for use in the metastability detector and synchronization circuit 300 of FIG. 3. Filter 500 includes a resistor 510, a capacitor 520, and a Schmitt trigger 530. Resistor 510 has a first terminal for receiving an input signal labeled "IN", and a second terminal. Capacitor 520 has a first terminal connected to the second terminal of resistor 510, and second terminal connected to ground. Schmitt trigger 530 has an input connected to the second terminal of resistor 510 and the first terminal of capacitor 520, and an output terminal for providing an output signal labeled "OUT".

Resistor 510 and capacitor 520 together form a lowpass filter and the sizes of resistor 510 and capacitor 520 determine its cutoff frequency. Schmitt trigger 530 has implicit hysteretic thresholds so that it transitions between high and low logic states rapidly and reliably. Thus filter 500 operates to attenuate high-frequency glitches in the IN signal and to help abnormal detection circuit 320 and normal detection circuit 330 to reliably detect operation state changes.

Figure 6:
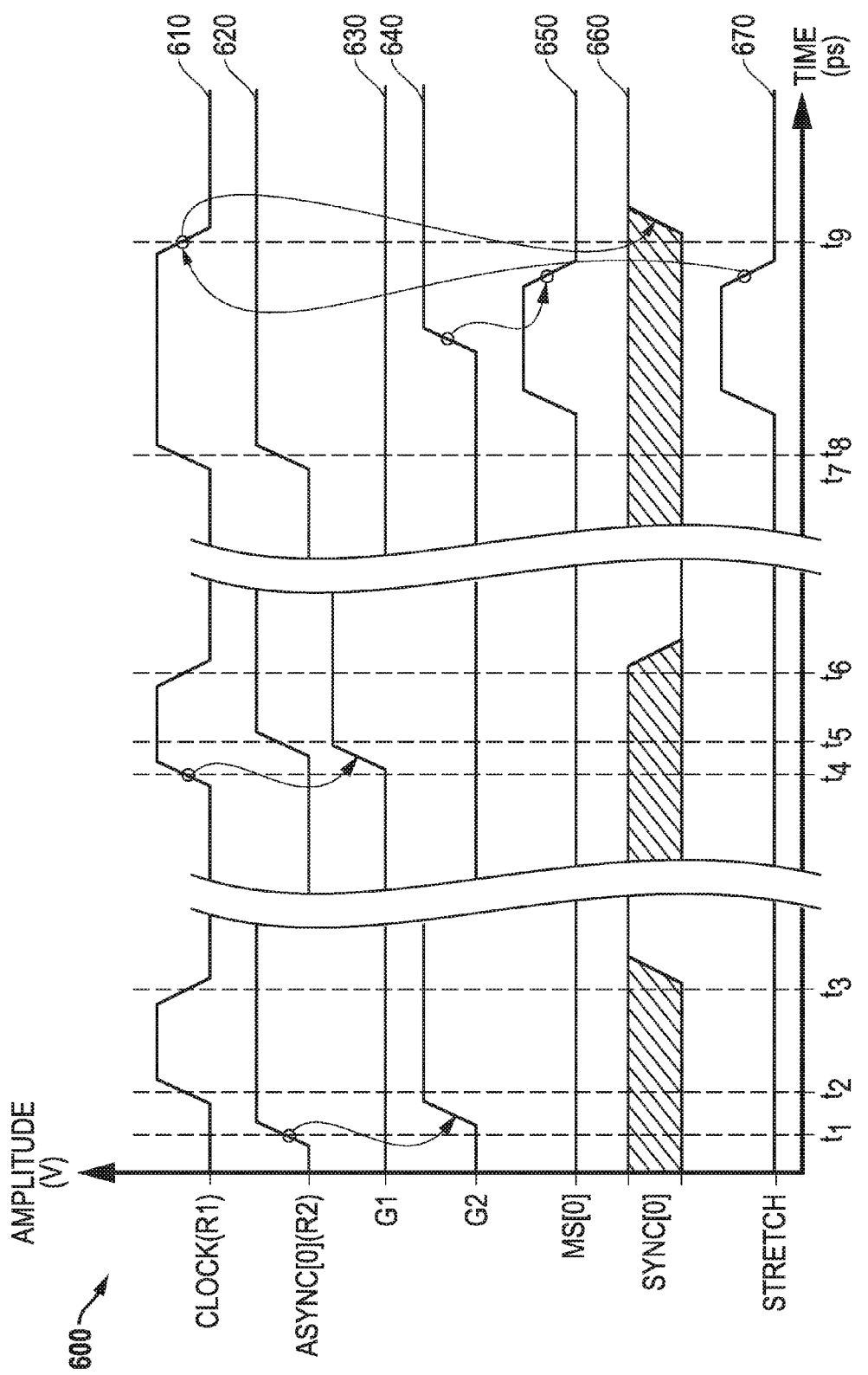
FIG. 6 illustrates a timing diagram showing the operation the metastability detector and synchronization circuit of FIG. 3.

FIG. 6 illustrates a timing diagram 600 showing the operation of metastability detector and synchronization circuit 300 of FIG. 3. In timing diagram 600, the vertical axis represents the amplitude of various signals in volts, whereas the horizontal axis represents time in picoseconds (ps). Shown in FIG. 6 is a set of waveforms including a waveform 610 showing the CLOCK signal, a waveform 620 showing the ASYNC[0] signal, a waveform 630 showing the G1 signal, a waveform 640 showing the G2 signal, a waveform 650 showing the MS[0] signal, a waveform 660 showing the SYNC[0] signal, and a waveform 670 showing the STRETCH signal.

In a first portion of timing diagram 600, the ASYNC[0] signal goes high at a time point labeled "$t_1$", and the CLOCK signal goes high at a subsequent time point labeled "$t_2$". In this example, there is enough setup time of signal ASYNC[0] before the rising edge of the CLOCK signal so that mutual exclusion circuit 310 does not go metastable. Accordingly, mutual exclusion circuit 310 keeps signal G1 low and signal G2 high, and keeps signal MS[0] low to indicate that it did not encounter metastability. Assuming there are no other signals experiencing metastability, mutual exclusion circuit 310 keeps the STRETCH low, and in response to the falling edge of the CLOCK signal, latch 350 provides signal SYNC[0] at a logic high.

In a second portion of timing diagram 600, the CLOCK signal goes high at a time point labeled "$t_4$", and the ASYNC[0] signal goes high at a subsequent time point labeled "$t_5$". In this example, there is enough hold time of the ASYNC[0] signal after the rising edge of the CLOCK signal so that mutual exclusion circuit 310 does not go metastable. Accordingly, mutual exclusion circuit 310 activates signal G1 high and keeps signal G2 low, and keeps signal MS[0] low to indicate that it did not encounter metastability. Assuming there are no other signals experiencing metastability, mutual exclusion circuit 310 keeps the STRETCH low, and in response to the falling edge of the CLOCK signal, latch 350 provides signal SYNC[0] at a logic low.

In a third portion of timing diagram 600, the ASYNC[0] signal goes high at a time point labeled "$t_7$", and the CLOCK signal goes high at a subsequent time point labeled "$t_8$". In this example, the ASYNC[0] and CLOCK signals have rising edges that are so closely aligned that mutual exclusion circuit 310 goes metastable. Accordingly, mutual exclusion circuit 310 keeps both signal G1 and signal G2 low during the period of metastability. Metastability detector and synchronization circuit 300 activates signal MS[0] to indicate the metastability. It further activates the STRETCH signal in response to MS[0]. Synchronous logic circuit 120 in turn keeps the CLOCK signal high until the metastability resolves. In this example, the rising edge of the ASYNC[0] signal leads the rising edge of the CLOCK signal so that mutual exclusion circuit 310 eventually provides signal G2 high while keeping signal G1 low. This transition causes metastability detector and synchronization circuit 300 to drive signal MS[0] low to indicate that the period of metastability has ended. Shortly thereafter, metastability detector and synchronization circuit 300 provides the STRETCH signal at a logic low, causing synchronous logic circuit 120 to provide the CLOCK signal low. The low value of the CLOCK signal causes latch 350 to provide the SYNC[0] signal at a logic high.

Thus a logic circuit 100 includes an asynchronous interface circuit 130 that detects metastability in logic signals as they transition between asynchronous timing domains. Logic circuit 130 prolongs operation only as long as the metastability persists, and logic circuit 100 operates reliably but with low latency and better performance than known metastability prevention circuits.

Logic circuit 100 of FIG. 1 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various circuits were described in the context of active-high logic, but could be modified to cover active-low logic. In addition the logic circuit could be implemented either with a fully asynchronous logic circuit that interfaces to a synchronous logic circuit, or with two circuits clocked by different clocks that have no predefined relationship to each other. SR flip-flop 340 and D-latch 350 could be implemented with other suitable types of storage elements. In addition the logic circuit itself can take a variety of forms such as central processing units (CPUs), graphics processing units (GPUs), communication controllers, and application specific logic circuits.

Accordingly, it is intended by the appended claims to cover all modifications of the disclosed embodiments that fall within the scope of the disclosed embodiments.

What is claimed is:

1. A logic circuit, comprising:
   an asynchronous logic circuit having a plurality of asynchronous outputs for providing a corresponding plurality of asynchronous signals;
   a synchronous logic circuit having a plurality of synchronous inputs corresponding to said plurality of asynchronous outputs, a stretch input for receiving a stretch signal, and a clock output for providing a clock signal, wherein said synchronous logic circuit provides said clock signal as a periodic signal but prolongs a predetermined state of said clock signal while said stretch signal is active; and
   an asynchronous interface coupled between said asynchronous logic circuit and said synchronous logic circuit, for detecting whether metastability could occur when latching any of said plurality of said asynchronous outputs of said asynchronous logic circuit using said clock signal, and activating said stretch signal while said metastability could occur.

2. The logic circuit of claim 1, wherein said asynchronous interface comprises:
   a plurality of metastability detector circuits corresponding to each of said plurality of asynchronous outputs of said asynchronous logic circuit wherein each of said plurality of metastability detector circuits activates a corresponding metastability signal in response to detecting metastability in a corresponding asynchronous signal with respect to a predetermined transition of said clock signal; and
   a logic gate for activating said stretch signal in response to an activation of said metastability signal of at least one of said plurality of metastability detector circuits.

3. The logic circuit of claim 2, wherein each metastability detector circuit comprises:
   a mutual exclusion circuit having a first request terminal for receiving said clock signal, a second request terminal for receiving a corresponding one of said plurality of asynchronous signals, a first grant terminal for activating a first grant signal in response to detecting that said first request is activated while said second request is inactive, and a second grant terminal for activating a second grant signal in response to detecting that said second request is activated while said first request is inactive, wherein said mutual exclusion circuit keeps said first and second grant signals inactive during any metastability between said clock signal and said corresponding one of said plurality of asynchronous signals,
   wherein said metastability detector circuit activates a corresponding metastability signal in response to said first grant signal being inactive for a delay period.

4. The logic circuit of claim 3, wherein said metastability detector circuit de-activates said corresponding metastability signal in response to said first grant signal subsequently being active for said delay period.

5. The logic circuit of claim 4, wherein said metastability detector circuit further comprises:
   an abnormal detection circuit for activating a set signal if said first grant signal is inactive while said clock signal is active for a predetermined time;
   a normal detection circuit for activating a reset signal if said first grant signal is active while said clock signal is active for said predetermined time; and
   a storage element coupled to said abnormal detection circuit and said normal detection circuit for being set to a first state in response to said set signal, and reset to a second state in response to said reset signal.

6. The logic circuit of claim 5, wherein said abnormal detection circuit comprises:
   an inverter having an input for receiving said first grant signal, and an output;
   a delay line having an input for receiving said clock signal, and an output;
   a first AND gate having a first input coupled to said output of said inverter, a second input for receiving said clock signal, a third input coupled to said output of said delay line, and an output; and
   a first filter having an input coupled to said output of said first AND gate, and an output for providing said set signal.

7. The logic circuit of claim 6, wherein said normal detection circuit comprises:
   a second AND gate having a first input for receiving said first grant signal, a second input for receiving said clock signal, a third input coupled to said output of said delay line of said abnormal detection circuit and an output; and
   a second filter having an input coupled to said output of said AND gate, and an output for providing said reset signal.

8. The logic circuit of claim 3, wherein said mutual exclusion circuit comprises:
   a first NAND gate having a first input coupled to said first request terminal, a second input, and an output;
   a second NAND gate having a first input coupled to said output of said first NAND gate, a second input coupled to said second request terminal, and an output coupled to said second input of said first NAND gate;
   a first inverter having an input coupled to said output of said second NAND gate, and an output coupled to said second grant terminal; and
   a second inverter having an input coupled to said output of said first NAND gate, and an output coupled to said first grant terminal.

9. The logic circuit of claim 3, wherein said metastability detector circuit further comprises:
   a storage element having a data input coupled to said second grant terminal, a clock input for receiving said clock signal, and an output terminal for providing a corresponding synchronous signal.

10. An asynchronous interface circuit, comprising:
    a plurality of metastability detector circuits corresponding to each of a plurality of asynchronous signals, wherein each of said plurality of metastability detector circuits activates a corresponding metastability signal in response to detecting that metastability could occur when latching a corresponding asynchronous signal with respect to a predetermined transition of a clock signal; and
    a logic gate for activating a stretch signal in response to an activation of said metastability signal of at least one of said plurality of metastability detector circuits.

11. The asynchronous interface circuit of claim 10, wherein each metastability detector circuit comprises:
    a mutual exclusion circuit having a first request terminal for receiving said clock signal, a second request terminal for receiving a corresponding one of said plurality of asynchronous signals, a first grant terminal for activating a first grant signal in response to detecting that said first request is activated while said second request is inactive, and a second grant terminal for activating a second grant signal in response to detecting that said second request is activated while said first request is inactive, wherein said mutual exclusion circuit keeps said first and second grant signals inactive during any metastability between said clock signal and said corresponding one of said plurality of asynchronous signals, wherein said metastability detector circuit activates a corresponding metastability signal in response to said first grant signal being inactive for a delay period.

12. The asynchronous interface circuit of claim 11, wherein said metastability detector circuit de-activates said corresponding metastability signal in response to said first grant signal subsequently being active for said delay period.

13. The asynchronous interface circuit of claim 12, wherein said metastability detector circuit further comprises:
    an abnormal detection circuit for activating a set signal if said first grant signal is inactive while said clock signal is active for a predetermined time;
    a normal detection circuit for activating a reset signal if said first grant signal is active while said clock signal is active for said predetermined time; and
    a storage element coupled to said abnormal detection circuit and said normal detection circuit for being set to a first state in response to said set signal, and reset to a second state in response to said reset signal.

14. The asynchronous interface circuit of claim 13, wherein said abnormal detection circuit comprises:
    an inverter having an input for receiving said first grant signal, and an output;
    a delay line having an input for receiving said clock signal, and an output;
    a first AND gate having a first input coupled to said output of said inverter, a second input for receiving said clock signal, a third input coupled to said output of said delay line, and an output; and
    a first filter having an input coupled to said output of said first AND gate, and an output for providing said set signal.

15. The asynchronous interface circuit of claim 14, wherein said normal detection circuit comprises:
    a second AND gate having a first input for receiving said first grant signal, a second input for receiving said clock signal, a third input coupled to said output of said delay line of said abnormal detection circuit and an output; and
    a second filter having an input coupled to said output of said AND gate, and an output for providing said reset signal.

16. The asynchronous interface circuit of claim 11, wherein said mutual exclusion circuit comprises:
    a first NAND gate having a first input coupled to said first request terminal, a second input, and an output;
    a second NAND gate having a first input coupled to said output of said first NAND gate, a second input coupled to said second request terminal, and an output coupled to said second input of said first NAND gate;
    a first inverter having an input coupled to said output of said second NAND gate, and an output coupled to said second grant terminal; and
    a second inverter having an input coupled to said output of said first NAND gate, and an output coupled to said first grant terminal.

17. The asynchronous interface circuit of claim 11, wherein said metastability detector circuit further comprises:
    a storage element having a data input coupled to said second grant terminal, a clock input for receiving said clock signal, and an output terminal for providing a corresponding synchronous signal.

18. A method comprising:
    receiving a plurality of asynchronous logic signals;
    detecting a corresponding metastability condition of each of said plurality of asynchronous logic signals with respect to a first transition of a clock signal;
    determining whether said corresponding metastability condition exists for any of said plurality of asynchronous logic signals with respect to said first transition of said clock signal wherein said corresponding metastability condition indicates that metastability could occur when latching a corresponding asynchronous logic signal using said first transition of said clock signal; and
    stretching a predetermined state of said clock signal following said first transition as long as said corresponding metastability condition exists for at least one of said plurality of asynchronous logic signals with respect to said first transition of said clock signal.

19. The method of claim 18, further comprising:
    latching said plurality of asynchronous logic signals to form a corresponding plurality of synchronous logic signals in response to second transition of said clock signal.

20. The method of claim 18, wherein said detecting comprises:
    detecting said corresponding metastability condition of each of said plurality of asynchronous logic signals with respect to said first transition of said clock signal using a mutual exclusion element.

* * * * *